US 8,547,706 B2

(12) United States Patent
Tamura et al.

(10) Patent No.: US 8,547,706 B2
(45) Date of Patent: Oct. 1, 2013

(54) ELECTRONIC COMPONENT, BOARD UNIT, AND INFORMATION-PROCESSING DEVICE

(75) Inventors: Hiroaki Tamura, Kawasaki (JP);
Fumihiko Tokura, Kawasaki (JP);
Michinao Nomura, Kawasaki (JP);
Toshihiro Kusagaya, Shinagawa (JP);
Kazuhiro Mizukami, Shinagawa (JP)

(73) Assignees: Fujitsu Limited, Kawasaki (JP); Fujitsu Component Limited, Tokyo (JP)

( * ) Notice: Subject to any disclaimer, the term of this patent is extended or adjusted under 35 U.S.C. 154(b) by 295 days.

(21) Appl. No.: 12/873,702

(22) Filed: Sep. 1, 2010

(65) Prior Publication Data
US 2011/0075386 A1 Mar. 31, 2011

(30) Foreign Application Priority Data
Sep. 30, 2009 (JP) ................................. 2009-228371

(51) Int. Cl.
*H04L 9/00* (2006.01)
(52) U.S. Cl.
USPC ............ 361/772; 361/771; 361/774; 361/777
(58) Field of Classification Search
USPC ........... 361/769–777; 174/262–265; 439/83, 439/843
See application file for complete search history.

(56) References Cited

U.S. PATENT DOCUMENTS

| 5,041,901 | A | * | 8/1991 | Kitano et al. | 257/779 |
| 5,455,446 | A | * | 10/1995 | Suppelsa et al. | 257/467 |
| 5,491,302 | A | * | 2/1996 | Distefano et al. | 174/260 |
| 6,024,584 | A | | 2/2000 | Lemke et al. | |
| 6,049,039 | A | | 4/2000 | Fushimi | |
| 6,079,991 | A | | 6/2000 | Lemke et al. | |
| 6,093,035 | A | | 7/2000 | Lemke et al. | |
| 6,113,399 | A | * | 9/2000 | Hundt et al. | 439/70 |
| 6,164,983 | A | | 12/2000 | Lemke et al. | |
| 6,358,068 | B1 | | 3/2002 | Houtz | |
| 6,552,275 | B2 | * | 4/2003 | Fartash et al. | 174/260 |

FOREIGN PATENT DOCUMENTS

| JP | 7-16370 U | 3/1995 |
| JP | 7-320800 A | 12/1995 |
| JP | 9-055244 A | 2/1997 |
| JP | 10-041042 A | 2/1998 |
| JP | 10-162909 A | 6/1998 |
| JP | 2008-119735 A | 5/2008 |

OTHER PUBLICATIONS

Japanese Office Action dated Apr. 2, 2013, issued in corresponding Japanese Patent Application No. 2009-228371, w/English translation (6 pages).

* cited by examiner

*Primary Examiner* — Tuan T Dinh
(74) *Attorney, Agent, or Firm* — Westerman, Hattori, Daniels & Adrian, LLP

(57) ABSTRACT

An electronic component includes: an electronic component body; and a lead secured to the electric component and including a projection portion defined by first and second inclined portions facing each other. The solder wettability of the first inclined portion is smaller than the solder wettability of the second inclined portion.

10 Claims, 12 Drawing Sheets

# ELECTRONIC COMPONENT, BOARD UNIT, AND INFORMATION-PROCESSING DEVICE

CROSS-REFERENCE TO RELATED APPLICATIONS

This application is based upon and claims the benefit of priority of the prior Japanese Patent Application No. 2009-228371, filed on Sep. 30, 2009, the entire contents of which are incorporated herein by reference.

FIELD

The embodiments discussed herein are related to an electronic component, a board unit, and an information-processing device.

BACKGROUND

It is known to join a lead of an electronic component with a given object by soldering. Technologies about the solder joint are disclosed in Japanese Unexamined Patent Application Publication Nos. 10-41042, 2008-119735, and 9-55244, and Japanese Unexamined Utility Model Application Publication No. 7-16370.

Leads of the electronic component and a printed board are jointed with each other by soldering. Further, there are electronic components with which leads are jointed by soldering. When the solder is melted, the solder might move all over the lead by capillary phenomenon. This might reduce the quantity of the solder contributing to the joint between the leads and a jointed object.

SUMMARY

According to an aspect of the embodiments, an electronic component includes: an electronic component body; and a lead secured to the electric component and including a projection portion defined by first and second inclined portions facing each other, solder wettability of the first inclined portion being smaller than solder wettability of the second inclined portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
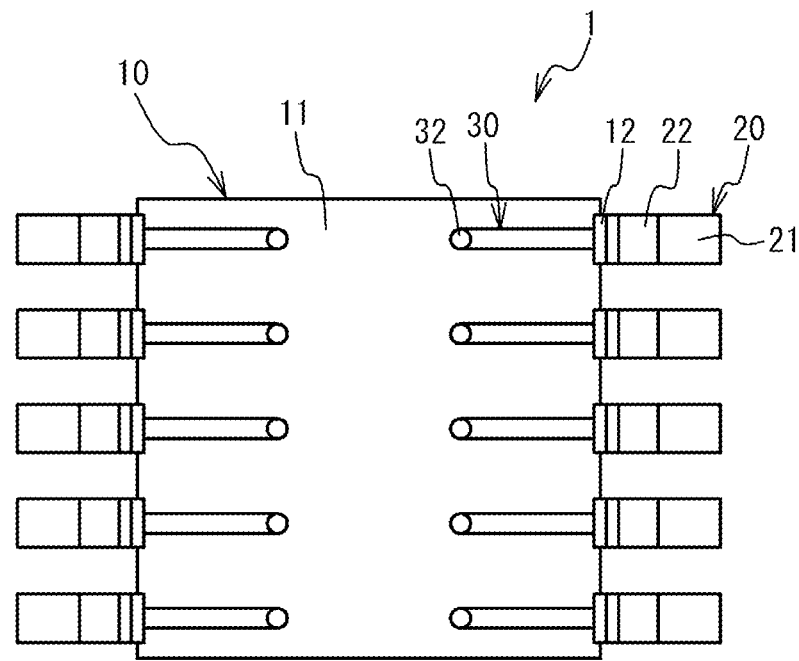
FIGS. 1A and 1B are explanatory views of a connector.
Figure 1B:
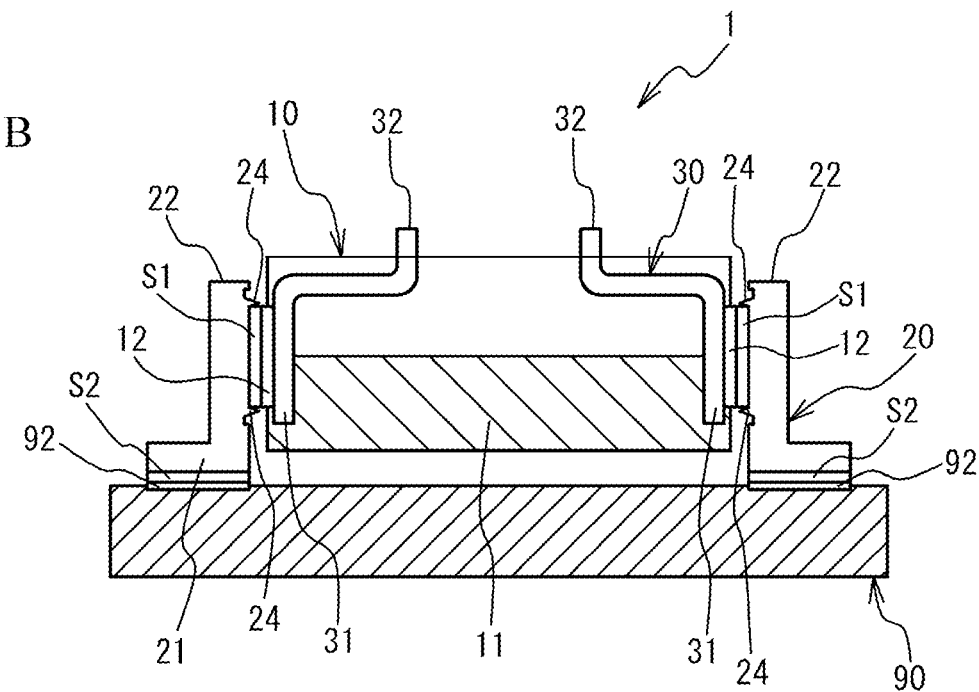

A description will be given of a connector as an example of an electronic component. FIGS. 1A and 1B are explanatory views of a connector 1 according to the present embodiment. FIG. 1B illustrates the connector 1 mounted on a printed board 90.

As illustrated in FIGS. 1A and 1B, the connector 1 includes: a main body 10; plural leads 20 secured to the main body 10; and plural pins 30 housed within the main body 10 and electrically connected to the plural leads 20, respectively. The shape of the main body 10 is a case that is provided with an opening at its upper portion. For example, the main body 10 is made of a synthetic resin. The main body 10 includes a bottom wall portion 11. Secured ends 31 of the pins 30 are press fitted into holes of the bottom wall portion 11, respectively. Free ends 32 protrude from the upper portion of the main body 10. The pin 30 is made of a metal. The main body 10 is provided with conductive pads 12 at its side surfaces. As illustrated in FIG. 1A, the conductive pads 12 are secured to two side surfaces, of the main body 10, facing each other. The number of the conductive pads 12 is identical with the number of the leads 20 and that of the pins 30. The conductive pad 12 and the lead 20 are jointed with each other by the solder S1. Therefore, the lead 20 and the pin 30 are electronically connected to each other. Since the conductive pad 12 and the lead 20 are jointed with each other by the solder S1, when the solder S1 is melted, the lead 20 is made possible to move relative to the main body 10. This will be described later. Lower ends 21 of the leads 20 are respectively jointed to electrodes 92 of the printed board 90 by solder S2. The connector 1 is mounted on a front surface of the printed board 90. As illustrated in FIG. 1B, the lead 20 is provided with two projection portions 24 that are arranged to sandwich the solder S1.

Figure 2A:
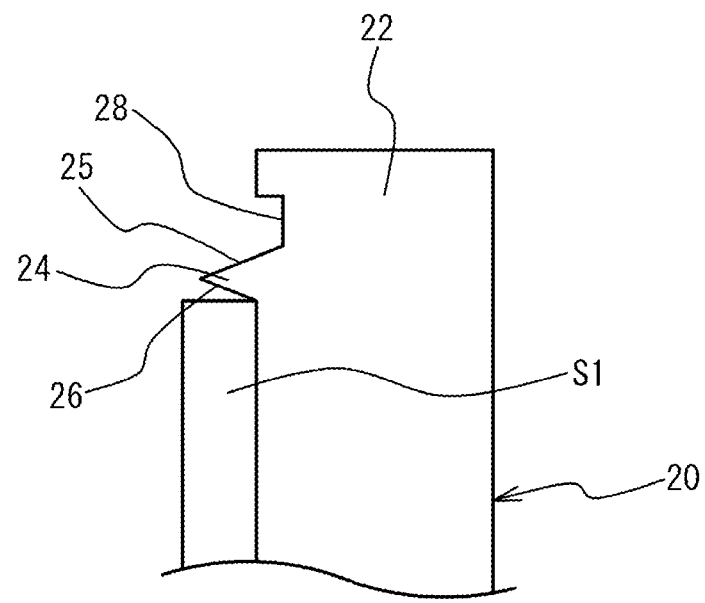
FIGS. 2A and 2B are enlarged views of the vicinity of projection portions.
Figure 2B:
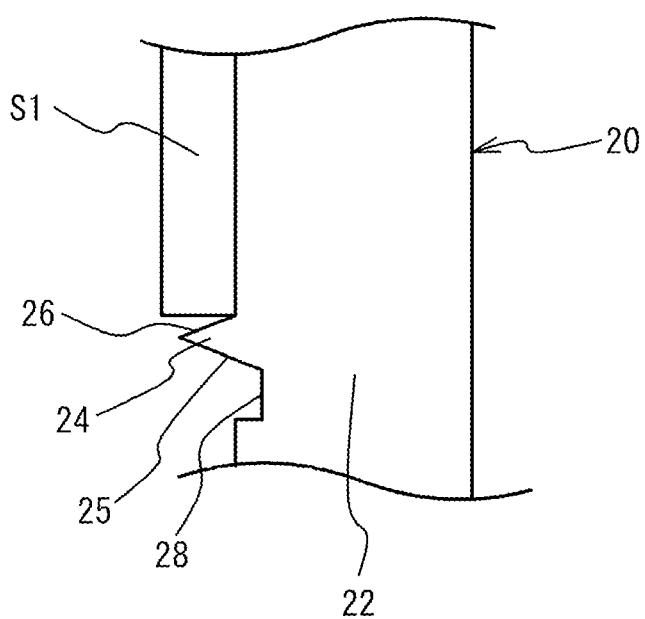

FIGS. 2A and 2B are enlarged views of the vicinity of the projection portions 24. FIG. 2A illustrates the projection portion 24 provided at the upper side of the lead 20. FIG. 2B illustrates the projection portion 24 provided at the lower side of the lead 20. As illustrated in FIG. 2A, the projection portion 24 includes a first inclined portion 25 and a second inclined portion 26 facing each other. The first inclined portion 25 and the second inclined portion 26 define the projection portion 24. Further, a recess portion 28 is arranged to be adjacent to the first inclined portion 25 of the projection portion 24. Likewise, as illustrated in FIG. 2B, a recess portion 28 is arranged to be adjacent to the first inclined portion 25, in the projection portion 24 provided at the lower side of the lead 20. The projection portion 24 and the recess portion 28 will be described later.

Figure 3A:
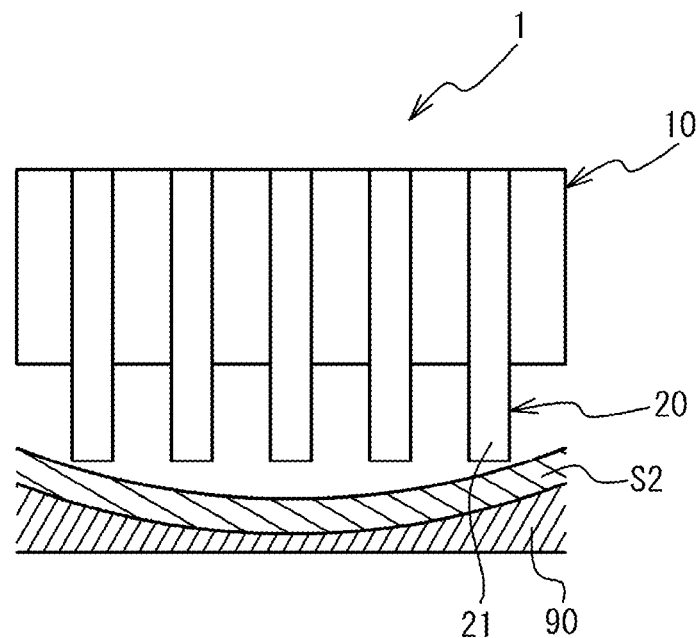
FIGS. 3A and 3B are explanatory views of mounting the connector on a printed board.
Figure 3B:
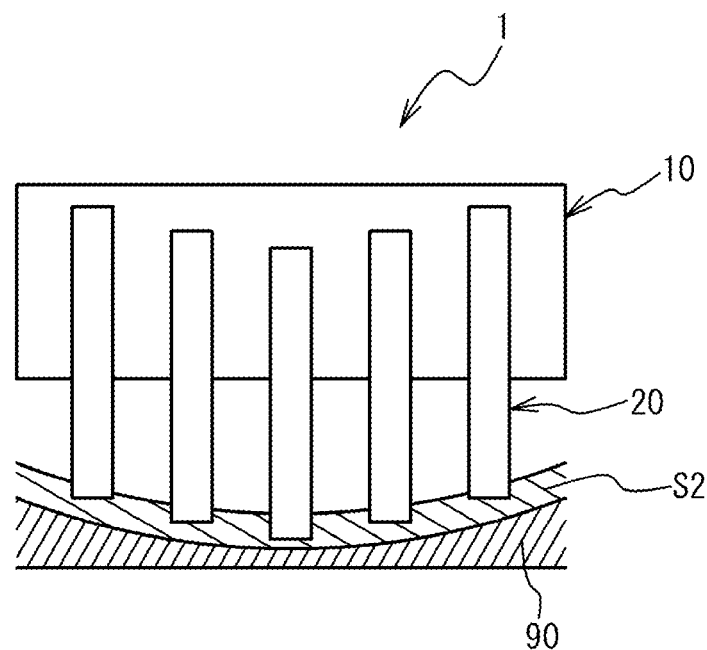

The mounting of the connector 1 on the printed board 90 will be described. FIGS. 3A and 3B are explanatory views of mounting the connector 1 on the printed board 90. When the connector 1 is mounted on the printed board 90, the connector 1 is arranged on the solder S2 that is beforehand printed or applied on the printed board 90. Therefore, the lower end 21 of the lead 20 is brought into contact with the solder S2.

However, as illustrated in FIG. 3A, when the printed board 90 is warped, at least one of plural leads 20 might not be in contact with the solder S2. If the connector 1 and the printed board 90 are reflowed in this situation, in addition to the solder S2, the solder S1 jointing the main body 10 with the lead 20 is melted. When the solder S1 is melted, the lead 20 moves downwardly relative to the main body 10 by the weight of the lead 20. Therefore, the lead 20, is not in contact with the solder S2 applied on the printed board 90 before reflowing, moves downwardly to be brought into contact with the solder S2 as illustrated in the FIG. 3B. In this state, when the connector 1 and the printed board 90 are cooled down, so that all the leads 20 are jointed to the solder S2. In this way, the leads 20 are made possible to move relative to the main body 10, thereby ensuring the electrical connection between the connector 1 and the printed board 90, even if the printed board 90 is warped. In addition, the surface tension of the solder S1 makes it difficult for the lead 20 to be detached from the main body 10.

Figure 4A:
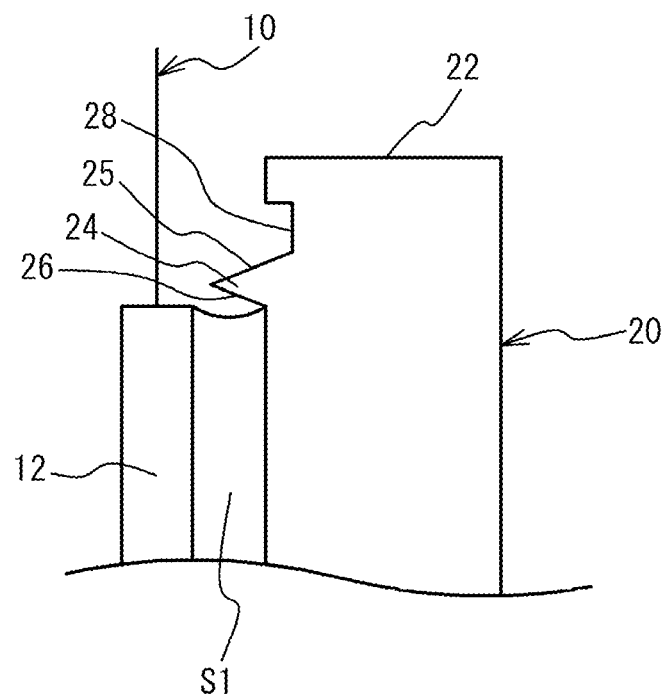
FIGS. 4A and 4B are explanatory views of the movement of a lead.
Figure 4B:
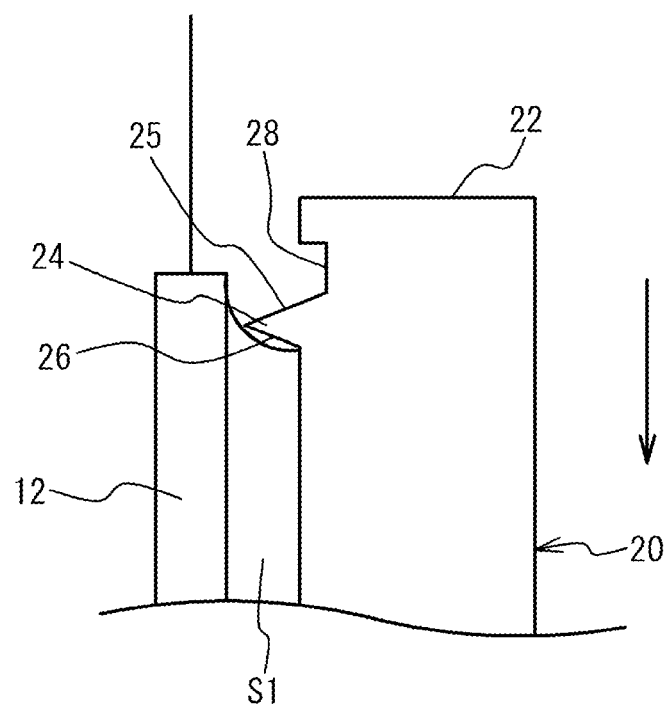

The movement of the lead 20 will be described. FIGS. 4A and 4B are explanatory views of the movement of the lead 20.

FIG. 4A illustrates the state before the solder S1 is melted. FIG. 4B illustrates the state where the solder S1 is melted and the lead 20 moves downwardly relative to the main body 10. When the solder S1 is melted, the solder S1 attempts to move on the lead 20 by capillary phenomenon. Moreover, when the lead 20 moves downwardly relative to the main body 10, the solder S1 readily moves to the upper end 22. However, the first inclined portion 25 is formed in the lead 20. With this arrangement, even if the lead 20 moves downwardly relative to the main body 10, the solder S1 can be prevented from moving from the second inclined portion 26 toward the first inclined portion 25.

Figure 5A:
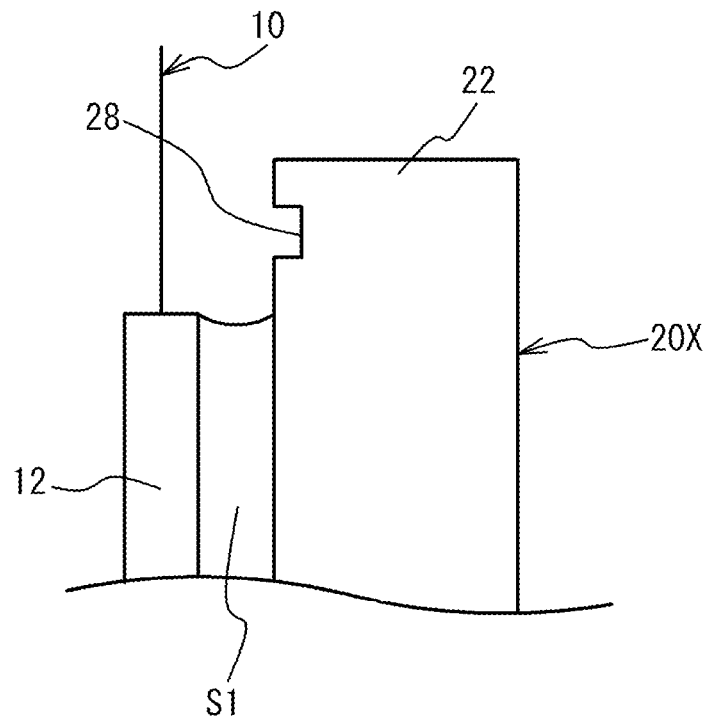
FIGS. 5A and 5B are explanatory views of the movement of a lead that is not provided with a projection portion.
Figure 5B:
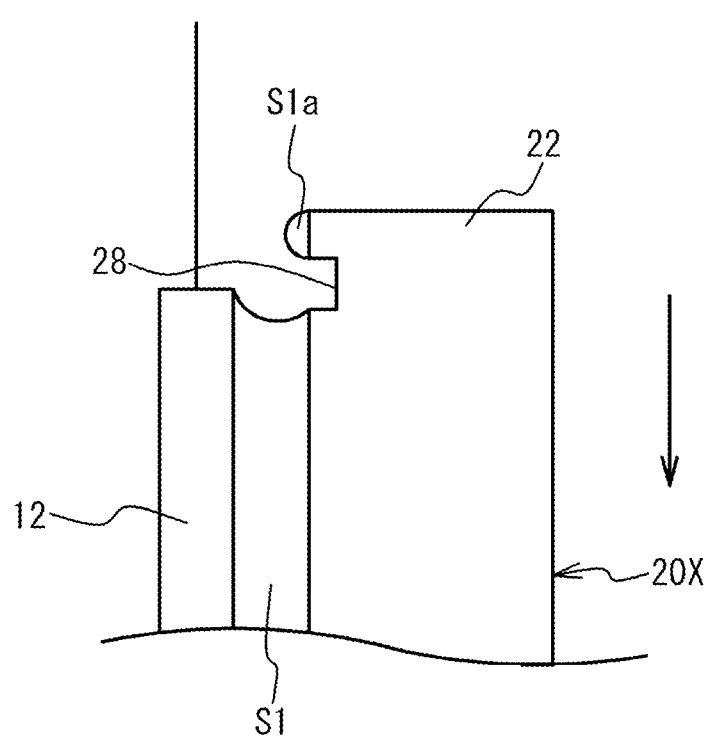

A description will be given of a lead 20x that is not provided with the projection portion 24. FIGS. 5A and 5B are explanatory views of the movement of a lead that is not provided with the projection portion 24. FIGS. 5A and 5B correspond to FIGS. 4A and 4B. Additionally, the lead 20 is provided with two projection portions 24. In contrast, the lead 20x is not provided with a projection portion 24. As illustrated in FIG. 5B, when the solder S1 is melted, the solder S1 moves toward the upper end 22 side by capillary phenomenon. As a result, solder S1a may be separated from the solder S1. In this state, when the solder S1 and S1a is cooled down and the conductive pad 12 and the lead 20x are jointed, the solder S1a does not contribute to the joint between the conductive pad 12 and the lead 20x. This reduces the quantity of the solder S1 jointing the conductive pad 12 with the lead 20x.

However, in the connector 1 according to the present embodiment, the lead 20 includes the projection portion 24 as illustrated in FIG. 4B. This prevents the reduction of the quantity of the solder S1 contributing to the joint between the conductive pad 12 and the lead 20. Also, the lead 20 is provided with the projection portion 24 at the lower end 21 side. Therefore, the melted solder S1 is prevented from moving toward the lower side of the lead 20.

Further, the moving distance of the lead 20x that is not provided with the projection portion 24 is about (0.4 mm. In contrast, the moving distance of the lead 20 that is provided with the projection portion 24 is about ±0.6 mm. In this way, the connector 1 according to the present embodiment can be suitably mounted on a printed board that is greatly warped. Therefore, the yield rate of the mounting of the connector 1 on the printed board 90 is improved.

Figure 6:
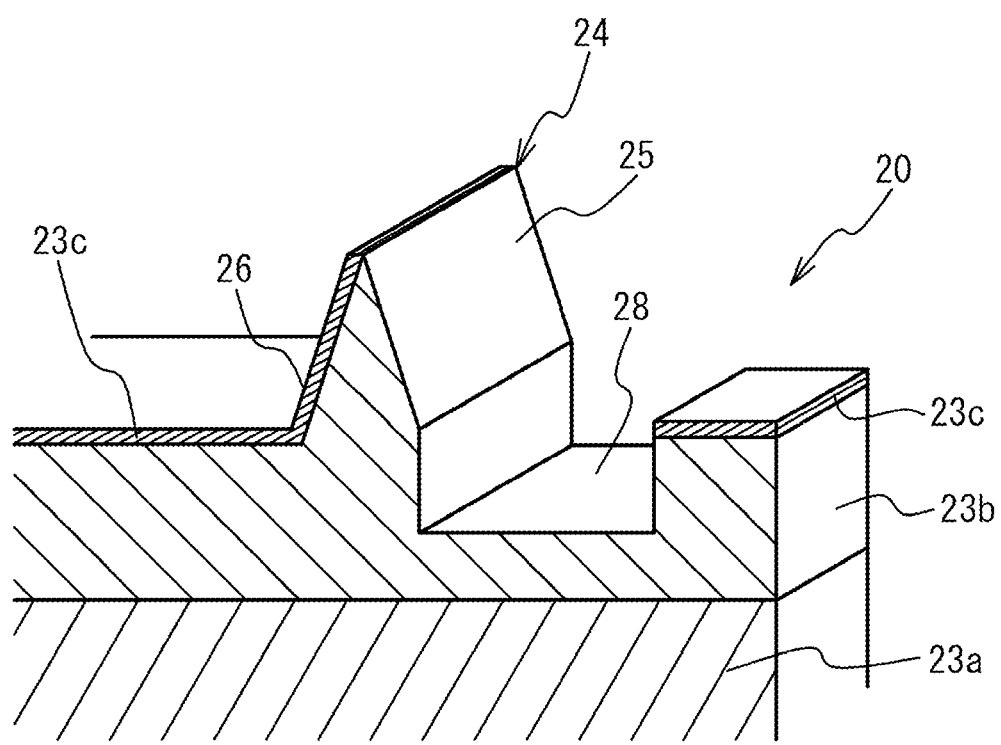
FIG. 6 is a cutaway view of the vicinity of the projection portion of the lead.

A description will be given of the first inclined portion 25. FIG. 6 is a cutaway view of the vicinity of the projection portion 24 of the lead 20. As illustrated in FIG. 6, the lead 20 includes: a base material 23a; an Ni layer 23b layered at the outer side of the base material 23a; and an Au layer 23c layered at the outer side of the Ni layer 23b. The base material 23a corresponds to a base material of the lead 20. The Ni layer 23b is layered on the base material 23a by plating. Likewise, the Au layer 23c is layered on the Ni layer 23b by plating. In the first inclined portion 25, the Ni layer 23b is exposed. In the second inclined portion 26, the Ni layer 23b is covered with the Au layer 23c. The wettability of the Au layer 23c is greater than that of the Ni layer 23b. In other words, the solder wettability of the first inclined portion 25 is smaller than that of the second inclined portion 26. The angle between the first inclined portion 25 and the second inclined portion 26 is an acute one.

A wetting angle of the solder will be described.

Figure 7A:
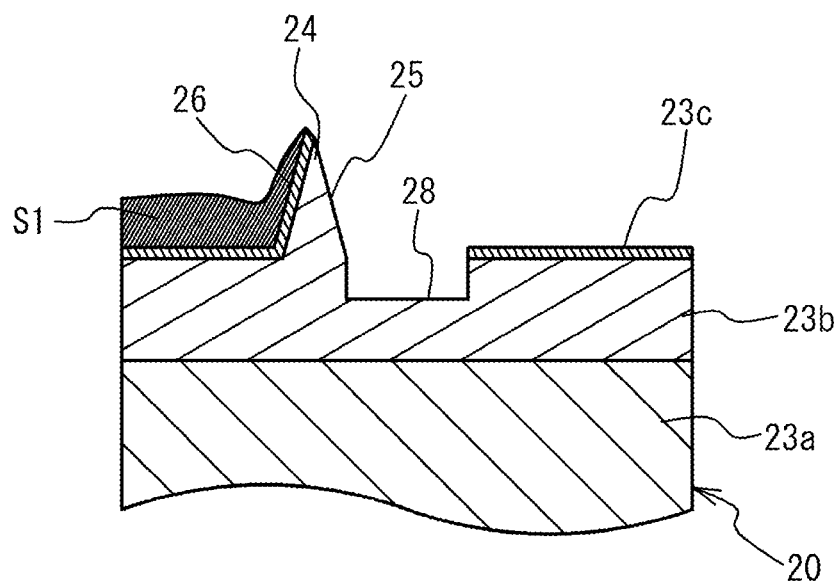
FIGS. 7A and 7B are explanatory views of the wetting angle of the solder.
Figure 7B:
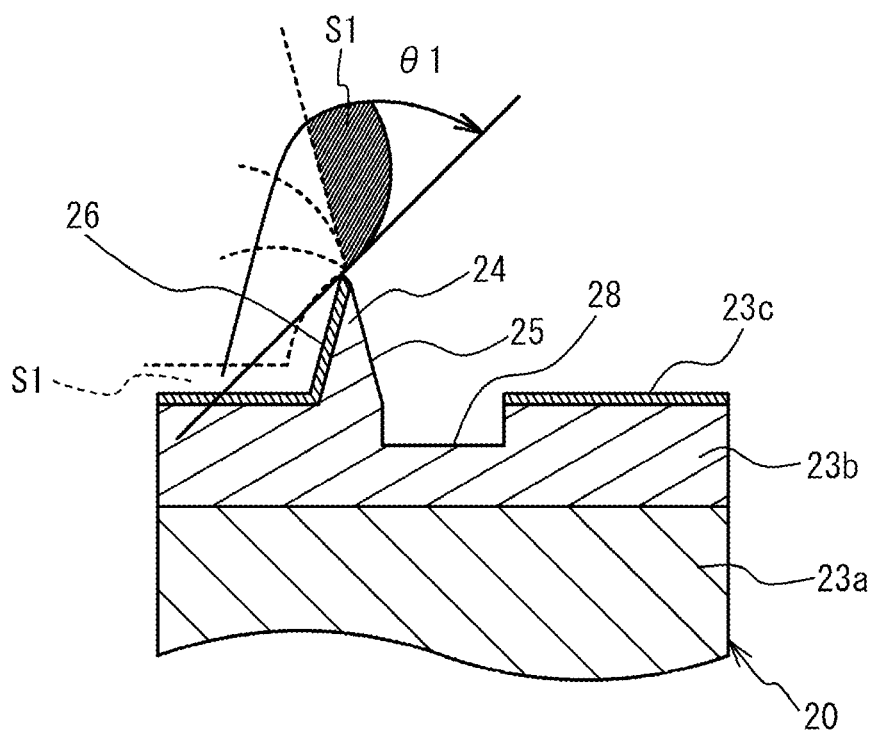

FIGS. 7A, 7B, 8A, and 8B are explanatory views of the wetting angle of the solder. FIGS. 7A and 7B are explanatory views of the wetting angle of the solder on the lead 20 provided with the projection portion 24. As illustrated in FIG. 7A, it is assumed that the capillary phenomenon and the movement of the lead 20 cause the melted solder S1 to move from the second inclined portion 26 toward the first inclined portion 25. In this case, the angle θ1 between the wetting angle of the solder S1 on the second inclined portion 26 and that on the first inclined portion 25 is relatively large.

Figure 8A:
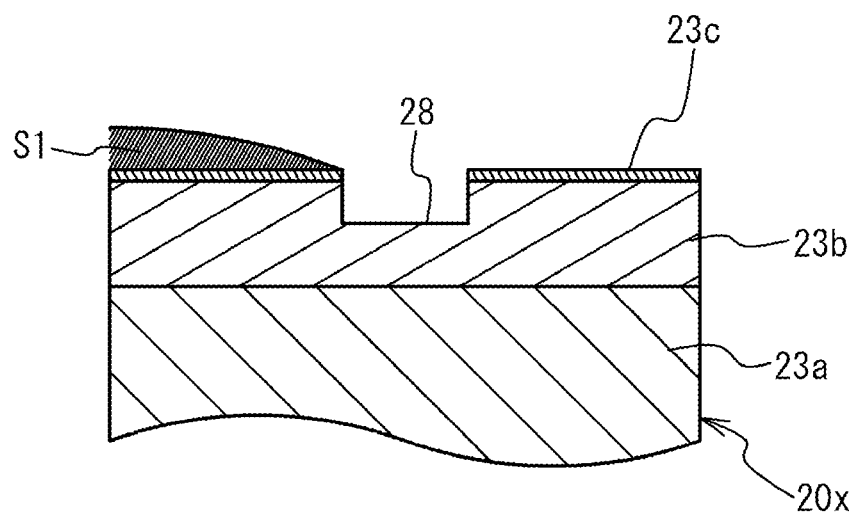
FIGS. 8A and 8B are explanatory views of the wetting angle of the solder.
Figure 8B:
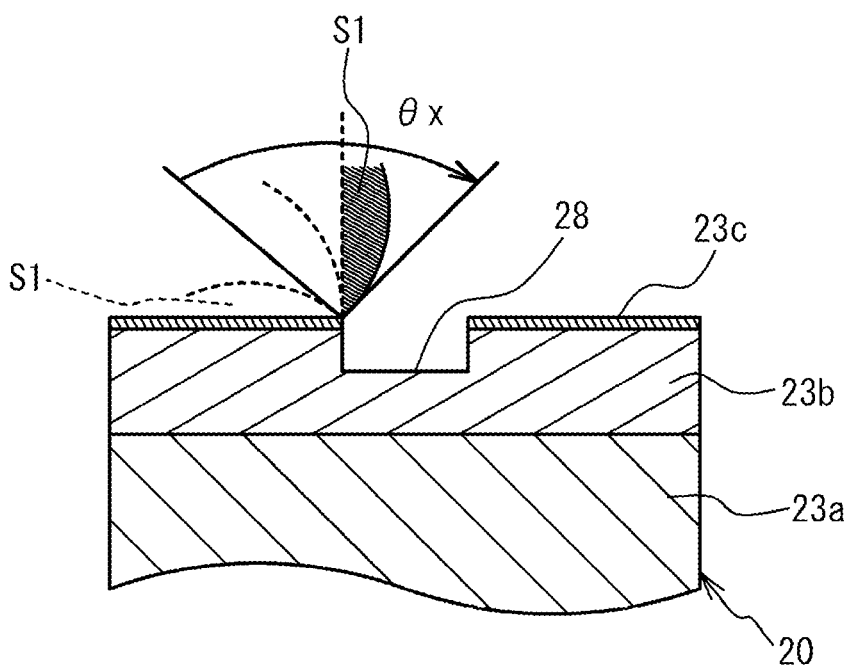

FIGS. 8A and 8B are explanatory views of the wetting angle of the solder on the lead 20x being not provided with the projection portion 24. As illustrated in FIGS. 8A and 8B, when the projection portion 24 is not provided, the angle θx between the wetting angle of the solder S1 in front of the recess portion 28 and that of the solder S1 moving on an inner side surface of the recess portion 28 is relatively small.

For this reason, it is easy for the solder S1 to move into the recess portion 28. However, it is not easy for the solder S1 to move from the second inclined portion 26 toward the first inclined portion 25. Therefore, the provision of the projection portion 24 prevents the melted solder from moving beyond the projection portion 24. In addition, as mentioned above, the solder wettability of the first inclined portion 25 is smaller than that of the second inclined portion 26. Thus, it is not easy for the solder to move from the second inclined portion 26 toward the first inclined portion 25. Furthermore, the angle between the first inclined portion 25 and the second inclined portion 26 is an acute one. Thus, the angle between the wetting angle of the solder S1 on the first inclined portion 25 and that on the second inclined portion 26 is relatively large. Therefore, it is not easy for the solder S1 to move from the second inclined portion 26 toward the first inclined portion 25.

Moreover, since the lead 20 is provided with the recess portion 28 adjacent to the projection portion 24, even when the melted solder moves beyond the projection portion 24 into the recess portion 28, the solder stays in the recess portion 28. This prevents the contact failure caused by the splash of the solder.

Additionally, as illustrated in FIG. 2B, the projection portion 24 and the recess portion 28 are provided at the lower end 21 side of the lead 20. This prevents the mixture of the melted solder S1 and S2 caused by reflowing or the like. Further, this prevents the failure of the joint between the lead 20 and the printed board 90 caused by the movement of the solder S2 over the lead 20.

The Ni layer is described as an example of a first layer layered on the base material of the lead 20, and the Au layer is described as an example of a second layer layered on the first layer. However, the first and second layers are not limited to the above layers. For example, the first layer may include at least one of Ni, Fe, Zn, Cr, Al, Be, Mo, and W, and the second layer may includes at least one of Au, Ag, Cu, Pd, Sn, and Pb.

Figure 9:
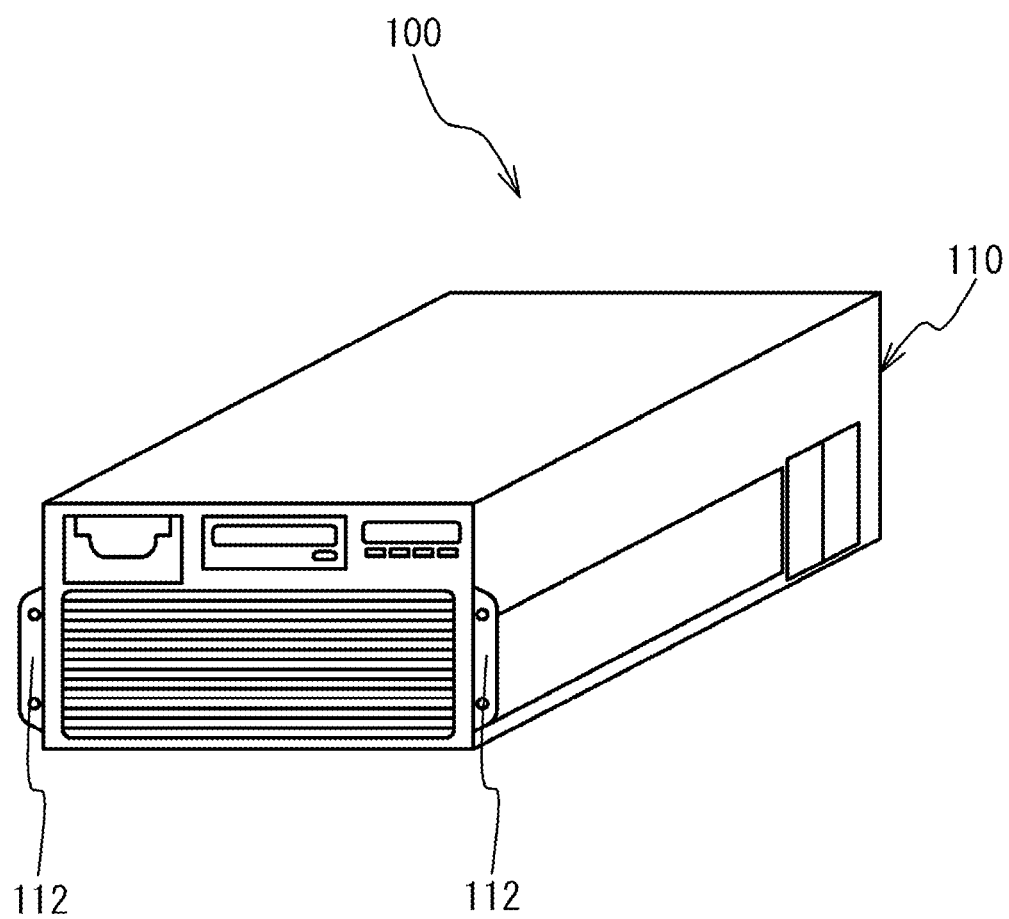
FIG. 9 is exemplary view of an information-processing device housing a board unit including the connector and a printed board.

FIG. 9 is exemplary view of an information-processing device 100 housing a board unit including the above connector 1 and the printed board 90. For example, the information-processing device 100 is a server. The information-processing device 100 includes a chassis 110. The chassis 110 houses a board unit including the connector 1 and the printed board 90 on which the connector 1 is mounted. The chassis 110 is provided with attachment pieces 112. The attachment pieces 112 are provided for attaching the information-processing device 100 to a rack. Additionally, the information-processing device including the above board unit is not limited to the above server. For example, the information-processing device may be a desktop computer or a notebook computer.

Figure 10:
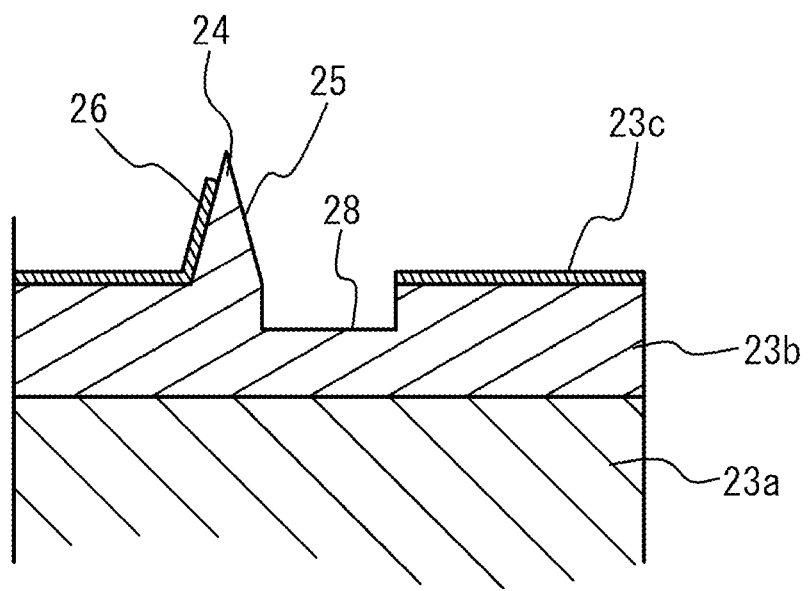
FIG. 10 is a cross-sectional view of the vicinity of a projection portion according to another example.

FIG. 10 is a cross-sectional view of the vicinity of a projection portion 24a according to another example.

As illustrated in FIG. 10, in the second inclined portion 26, the Ni layer 23b is partially exposed. In the first inclined portion 25, the Au layer 23c is not provided and the Ni layer 23b is exposed. Even in such a case, the solder wettability of the first inclined portion 25 is smaller than that of the second inclined portion 26, since the Ni layer 23b in the second inclined portion 26 side is partially covered with the Au layer 23c. Therefore, the melted solder is prevented from moving from the second inclined portion 26 toward the first inclined portion 25.

An electronic component that includes a semiconductor chip will be described.

Figure 11:
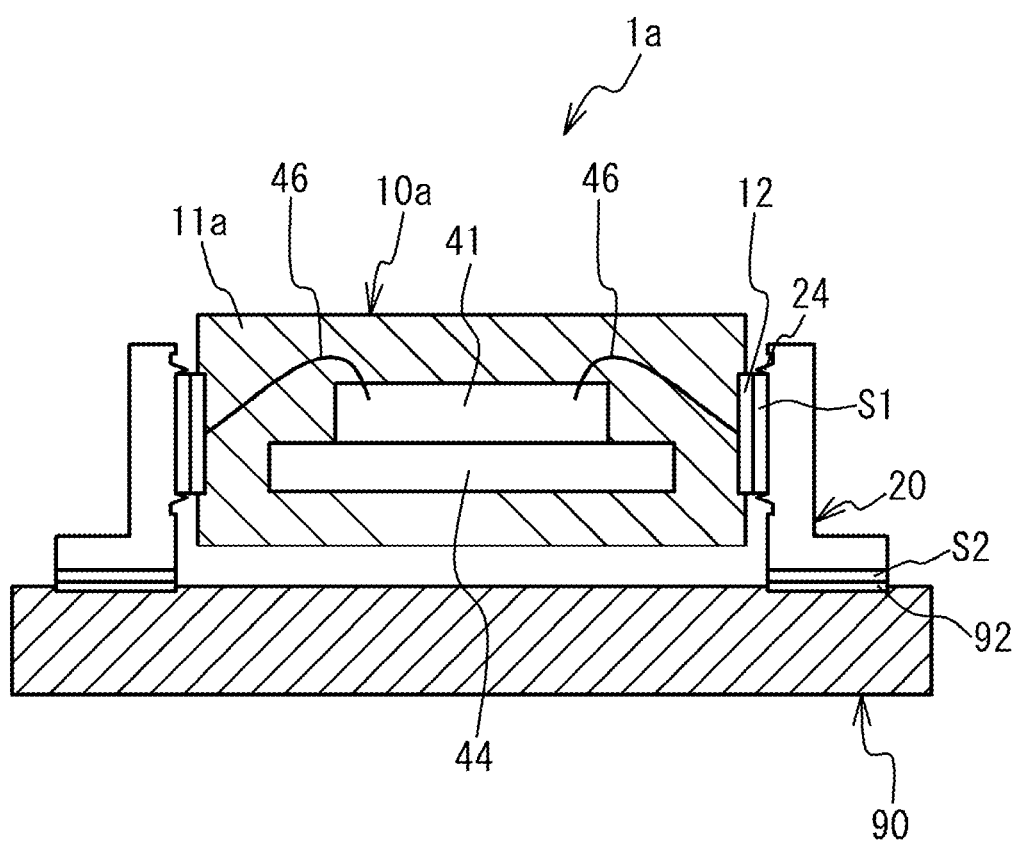
FIG. 11 is an explanatory view of an electronic component including a semiconductor chip.

FIG. 11 is an explanatory view of the electronic component including the semiconductor chip. A sealing resin 11a includes a main body 10a and leads 20. The main body 10a includes: a sealing resin 11a, conductive pads 12, a semiconductor chip 41, and a lead frame 44. The semiconductor chip 41 and the lead frame 44 are sealed with the sealing resin 11a. The conductive pads 12 are secured to the side surfaces of the sealing resin 11a. The semiconductor chip 41 and the conductive pad 12 are electrically connected to each other by bonding wires. The conductive pad 12 and the lead 20 are jointed by the solder S1. That is, when the solder S1 is melted, the lead 20 is capable of moving relative to the main body 10a. The lead 20 is provided with the projection portions 24 sandwiching the solder S1. In this way, even when the above lead is employed as a lead of an electronic component including a semiconductor chip in addition to a connector, the solder is prevented from moving all over the lead 20.

Figure 12A:
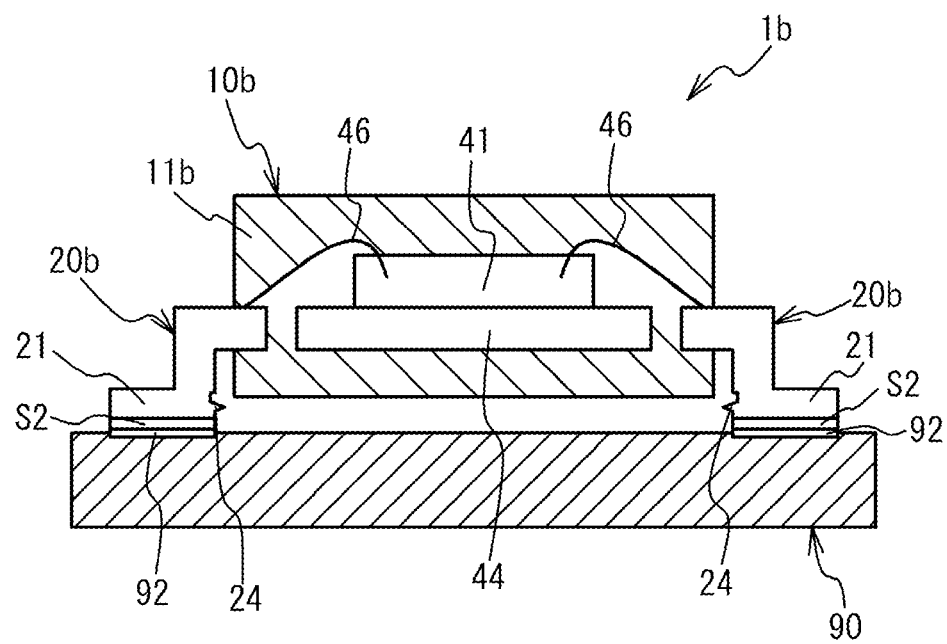
FIGS. 12A and 12B are explanatory views of an electronic component including a semiconductor chip.
Figure 12B:
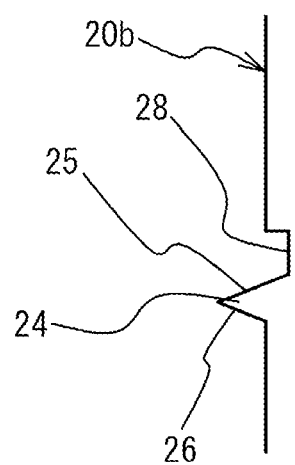

FIG. 12A is an explanatory view of an electronic component including the semiconductor chip. A chip package 1b includes a main body 10b and leads 20b. The main body 10b includes a sealing resin 11b, the semiconductor chip 41, and the lead frame 44. The sealing resin 11b includes the semiconductor chip 41 and the lead frame 44. The semiconductor chip 41 and the lead frame 44 are sealed with the sealing resin 11b. The semiconductor chip 41 and the lead 20b are electrically connected to each other by the bonding wires 46. Fixed ends of the lead 20b are sealed with the sealing resin 11b. FIG. 12B is an enlarged view of the vicinity of the projection portion 24. The second inclined portion 26 of the projection portion 24 faces the lower end 21 side. Before the chip package 1b is mounted on the printed board 90, the lower end 21 corresponds to a free end. Thus, unlike the aforementioned lead 20, the lead 20b does not move relative to the main body 10b.

The chip package 1b is mounted on the printed board 90 by reflowing. Thus, the solder S2 is melted by reflowing. When the solder S2 is melted, the solder S2 might move from the lower end 21 toward the upper end of the lead 20b by capillary phenomenon. In particular, this easily happens when the lead 20b is thin. However, the lead 20b is provided with the projection portion 24, and the second inclined portion 26 having greater solder wettability faces the lower end 21. That is, the second inclined portion 26 faces the solder S2 side. The first inclined portion 25 having smaller solder wettability faces the secured end of the lead 20b. Therefore, the melted solder S2 is prevented from moving over the lead 20. Thus, this prevents the reduction of the quantity of the solder contributing to the joint between the lower end 21 and the electrode 92 caused by the movement of the melted solder S2 over the lead 20b.

Further, when the read is thin, an area of the lower end of the lead might be smaller than that of the solder S2 applied on the electrode 92. In such a case, an error in the quantity of the applied solder may be increased against the area of the lower end of the lead. When an error in the quantity of the applied solder is large, the melted solder might move over the lead by the capillary phenomenon and might be attached to an adjacent lead. Therefore, the adjacent leads may be jointed by the solder and short-circuited. However, since the lead 20b is provided with the projection portion 24, the short-circuit of the lead 20b can be prevented.

Additionally, the chip package 1b is an example of the surface mounting type electronic component. The surface mounting type electronic components include SOP, QFP, TSOP, and the like. The aforementioned leads are employed as leads of these electronic components, thereby preventing the melted solder from moving over the lead. Further, the lead having the aforementioned projection portion may be employed as leads of pin-insertion mounting type electronic components. Furthermore, such a lead may be employed in a backplane used in a server or the like.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An electronic component comprising:
   an electronic component body; and
   a lead secured to the electric component body and comprising a projection portion defined by first and second inclined portions facing each other, solder wettability of the first inclined portion being smaller than solder wettability of the second inclined portion; wherein: the first inclined portion comprises a first layer exposed in the first inclined portion; and the second inclined portion comprises the first layer and a second layer positioned on at least of an outer side of the first layer, solder wettability of the second layer being larger than solder wettability of the first layer.

2. The electronic component of claim 1, wherein the lead comprises a recess portion adjacent to the first inclined portion of the projection portion.

3. The electronic component of claim 1, wherein an angle between the first and second inclined portions is an acute angle.

4. The electronic component of claim 1, wherein:
the first layer is a metallic layer comprising at least one of Ni, Fe, Zn, Cr, A1, Be, Mo, and W; and the second layer is a metallic layer comprising at least one of Au, Ag, Cu, Pd, Sn, Pb.

5. The electronic component of claim 1, wherein:
the lead is secured to the electronic component body by soldering and is capable of moving relative to the electronic component by the solder that is melted; and
the second inclined portion faces the solder side.

6. The electronic component of claim 5, wherein the projection portion comprises first and second projection portions sandwiching the solder.

7. The electronic component of claim 1, wherein:
the lead comprises a free end, and a secured end secured to the electronic component body; and
the second inclined portion faces the free end.

8. A board unit comprising:
an electronic component comprising:
an electronic component body; and
a lead secured to the electric component body and comprising a projection portion defined by first and second inclined portions facing each other, solder wettability of the first inclined portion being smaller than solder wettability of the second inclined portion; and
a printed board on which the electronic component is mounted; wherein: the first inclined portion comprises a first layer exposed in the first inclined portion; and the second inclined portion comprises the first layer and a second layer positioned on at least of an outer side of the first layer, solder wettability of the second layer being larger than solder wettability of the first layer.

9. An information-processing device comprising:
a board unit comprising:
an electronic component comprising:
an electronic component body; and
a lead secured to the electric component body and comprising a projection portion defined by first and second inclined portions facing each other, solder wettability of the first inclined portion being smaller than solder wettability of the second inclined portion; and
a printed board on which the electronic component is mounted; and
a chassis housing the board unit; wherein: the first inclined portion comprises a first layer exposed in the first inclined portion; and the second inclined portion comprises the first layer and a second layer positioned on at least of an outer side of the first layer, solder wettability of the second layer being larger than solder wettability of the first layer.

10. The electronic component of claim 1, wherein:
a surface of the lead is secured to the electric component body by soldering;
the projection portion is formed adjacent to the surface of the lead;
the second inclined portion is located at a side of a solder by which the lead is secured to the electric component body; and
the first inclined portion is located at an opposite side of the solder.

* * * * *